US 8,704,508 B2

(12) United States Patent
Fey et al.

(10) Patent No.: US 8,704,508 B2
(45) Date of Patent: Apr. 22, 2014

(54) METHOD AND PULSE-WIDTH-MODULATED CURRENT CONTROL CIRCUIT FOR DRIVING INDUCTIVE LOADS IN MOTOR VEHICLES

(75) Inventors: Wolfgang Fey, Bodolz (DE); Micha Heinz, Darmstadt (DE); Wolfgang Joeckel, Gernsfeld (DE); Peter Oehler, Frankfurt (DE); Axel Schmitz, Hattersheim (DE); Frank Michel, Rosbach (DE)

(73) Assignee: Continental Teves AG & Co. oHG (DE)

( * ) Notice: Subject to any disclaimer, the term of this patent is extended or adjusted under 35 U.S.C. 154(b) by 1288 days.

(21) Appl. No.: 12/300,488

(22) PCT Filed: May 11, 2007

(86) PCT No.: PCT/EP2007/054552
§ 371 (c)(1),
(2), (4) Date: Aug. 6, 2009

(87) PCT Pub. No.: WO2007/131947
PCT Pub. Date: Nov. 22, 2007

(65) Prior Publication Data
US 2011/0057645 A1 Mar. 10, 2011

(30) Foreign Application Priority Data

May 17, 2006 (DE) .......................... 10 2006 023 342
Jul. 27, 2006 (DE) .......................... 10 2006 035 564

(51) Int. Cl.
*G01R 1/14* (2006.01)
(52) U.S. Cl.
USPC ........................................................ 324/125
(58) Field of Classification Search
None
See application file for complete search history.

(56) References Cited

U.S. PATENT DOCUMENTS

| 5,311,548 | A | 5/1994 | Nikolaus | |
|---|---|---|---|---|
| 6,693,571 | B2 * | 2/2004 | Melanson et al. | 341/143 |
| 6,762,704 | B1 * | 7/2004 | Melanson et al. | 341/143 |
| 7,027,939 | B2 | 4/2006 | Fey et al. | |
| 7,047,119 | B2 | 5/2006 | Fey et al. | |
| 8,131,439 | B2 * | 3/2012 | Oehler et al. | 701/70 |
| 8,339,092 | B2 * | 12/2012 | Cox et al. | 318/685 |
| 2006/0039572 | A1 * | 2/2006 | Mun | 381/106 |
| 2006/0209486 | A1 | 9/2006 | Fey et al. | |

FOREIGN PATENT DOCUMENTS

| DE | 40 06 298 A1 | 9/1990 |
|---|---|---|
| DE | 41 09 233 A1 | 9/1992 |
| DE | 199 15 593 A1 | 11/2000 |
| DE | 100 65 239 A1 | 8/2001 |
| DE | 102 00 771 A1 | 8/2002 |
| DE | 10 2004 017 239 A1 | 12/2004 |
| DE | 10 2005 012 752 A1 | 9/2006 |
| GB | 2230393 | 10/1990 |
| WO | WO 02/058967 A | 8/2002 |
| WO | WO 03/039904 A | 5/2003 |
| WO | WO 2005/009815 A | 2/2005 |

* cited by examiner

*Primary Examiner* — Jermele M Hollington
*Assistant Examiner* — Trung Nguyen
(74) *Attorney, Agent, or Firm* — RatnerPrestia

(57) ABSTRACT

Method in which the current is measured inside an integrated PWM control circuit using at least one A/D converter which is likewise integrated in the circuit is described. The PWM controller is provided for the purpose of driving inductive loads and is arranged, in particular, in an electronic circuit of an electronic controller for a motor vehicle braking system. Before determining the actual current of the PWM controller, which is determined using the at least one A/D converter, the current is smoothed using a low-pass filter. A circuit arrangement for carrying out the above method and its use in electronic motor vehicle control systems is also described herein.

22 Claims, 8 Drawing Sheets

METHOD AND PULSE-WIDTH-MODULATED CURRENT CONTROL CIRCUIT FOR DRIVING INDUCTIVE LOADS IN MOTOR VEHICLES

CROSS REFERENCE TO RELATED APPLICATIONS

This application is the U.S. national phase application of PCT International Application No. PCT/EP2007/054552, filed May 11, 2007, which claims priority to German Patent Application No. DE 102006023342.5, filed May 17, 2006 and German Patent Application No. DE 102006035564.4, filed Jul. 27, 2006, the contents of such applications being incorporated by reference herein in their entirety.

BACKGROUND OF THE INVENTION

1. Field of the Invention

The invention relates to a pulse-width-modulated current control circuit for driving inductive loads in motor vehicles and to its use.

2. Background of the Invention

Electronic motor vehicle control units, such as controllers for ABS and/or ESP motor vehicle brake control units, comprise multiply redundant microprocessor systems and additional power circuits for driving loads such as, for example, the electromagnetic valve solenoids which are necessary for regulating pressure. Modern electronic brake control units for brakes now only comprise for this purpose a limited number of highly integrated components in which most of the discrete components of the controller are combined in two integrated modules, or even just one integrated module. An integration stage which is customary nowadays comprises two integrated circuits, with the microcomputer systems being combined in a first component and the power circuits being combined in a second, mixed analog/digital circuit. In the second integrated circuit there is also an analog/digital converter making available the analog value for the microcontroller as digital values. For reasons of cost it is advantageous to use a single A/D converter for a plurality of measurements.

In high-quality electronic ABS and ESP brake control systems, the valve solenoids are, at least partially, no longer switched but rather analogized driving is carried out by means of a pulse-width-modulated current controller (PWM) which permits virtually analog driving of the hydraulic valves. For this purpose, multi-channel PWM driver stages are provided which can be constructed, for example, by means of MOS transistors which are switched in antiphase. In order to permit an economic and space-saving solution, such a PWM stage is usually implemented as an integrated circuit, especially since up to eight of such stages have to be present for a complex ESP system as well as numerous additional circuit components. A pure analog amplifier for driving a valve solenoid is not practical because of an excessively high power loss.

The basic procedure when using a single A/D converter for measuring the actual current within a PWM controller for driving the abovementioned valve solenoids is already known from WO 02/058967 A2 (P 10057) and WO 03/039904 A2 (P 10253). According to the circuit examples described therein, a specific number of current-measuring channels are assigned to the A/D converter in accordance with a complex priority logic corresponding to a time slice principle so that its conversion capacity can be used in the best way possible.

The requirements which are made of the above electronic control units are continually increasing since additional functions are also performed by the brake control unit and the brake systems are intended to exhibit improved control quality. A number of relatively recent control functions, including motor vehicle longitudinal control (ACC) which maintains a constant distance from a vehicle traveling in front, require, above and beyond the pure possibility of setting an analog current, particularly precise current control since the smallest deviations from the desired current value bring about perceptible differences in the brake pressure which is set, with the result that precise ACC control with corresponding comfort is no longer possible. In addition, even small differences between the pressure which is set at the front axle and the rear axle during a relatively long period of ACC control can lead to a failure of the brake function of an axle. In particular, relatively low currents in the range from approximately 100 to 400 mA should have a high level of precision since these currents are required to set small pressure differences such as are typical for longitudinal control.

In the case of PWM stages which are embodied according to the previously mentioned patent applications WO 02/058967 A2 (P 10057) and WO 03/039904 A2 (P 10253) there is therefore need to improve the precision of PWM current control still further. In a PWM mentioned controller according to the prior art, considered in general terms an inductive load (for example valve solenoid) is actuated in the general application case of brake control. The inductive load has a specific inductance L and an ohmic resistance R. A time constant of the load L/R can be defined from the inductance L. Depending on this time constant and the pulse-width-modulation frequency which is aimed at a typical profile of the current $I_L$ due to the inductive load plotted against the time t is obtained as indicated in FIG. 1. As a result of the use of an A/D converter which is used repeatedly for measuring current in different PWM channels, the current cannot be determined at a plurality of points of the current profile in FIG. 1. The current is therefore measured at specific times (time-discrete measurements), as described in the documents cited above. The current value which is determined in this way deviates considerably, depending on the measuring time, from the mean value of the current which is to be actually determined for the PWM controller. This deviation from the mean value is also referred to below as form error. If, as illustrated in FIG. 2, the current value is, for example, measured regularly in the center of the switch-on phase at the time $t_{ON}/2$, the form error which is illustrated in FIG. 2 is produced as a difference between the measured value and the mean value.

However, the form error is not only influenced by the measuring time of the discrete measurement of current but also by other operating parameters of the PWM controller such as, for example, the high side voltage which is present on the load and by the temperature-dependent ohmic resistance of the load at the particular time. In particular, integrated analog circuits reach a high absolute precision level only at very high cost. Although, for example, differential circuit technologies known per se and trimming techniques which are known per se permit a certain degree of independence from technological variations and temperature effects, there are limits on these methods owing to the high degree of expenditure. Trimming the circuit by means of the temperature would take a very long time during fabrication and is therefore less advantageous in terms of fabrication with high production numbers.

In order to measure current, an arrangement composed of a sense FET in conjunction with a respectively assigned sense amplifier is used in the PWM stages according to the patent applications WO 02/058967 A2 (P 10057) and WO 03/039904 A2 (P 10253) which have already been mentioned. The sense FET which is used in this arrangement typically has a temperature-dependent switch-on resistance which already leads to an extremely high measurement error at least at currents in the mA range in conjunction with an offset error which is usually present in the sense amplifier.

The current measuring principle which is illustrated in FIG. 2 requires a minimum value for the switch-on period of the PWM signal for a current value to be able to be sensed under all peripheral conditions in every period. The consequence of this minimum value is that a minimum current, below which control is no longer possible, results depending on the ohmic resistance of the solenoid, the high side voltage at the inductance and the PWM frequency which is set. In the typical application case of an ACC controller for motor vehicles, it is therefore possible, for example, only to apply currents up to a minimum of 200 mA. However, ACC-optimized current/brake pressure characteristic curves of a valve solenoid usually require lower currents down to approximately 100 mA.

The resolution of a PWM current controller determines the precision levels with which currents can be set. This depends essentially on the maximum current which can be set and on the resolution of the A/D converter which is provided for measurement of the actual value of the current.

SUMMARY OF THE INVENTION

An object of the present invention is to specify a method and a circuit arrangement for PWM current control with which more precise and reliable setting of a current can be performed.

In the method according to aspects of the invention, the current within an integrated PWM control circuit is measured by means of at least one A/D converter which is, in particular, also integrated into the circuit. In this context, the A/D converter converts an electrical value which has preferably previously been determined with at least one current measuring element (for example resistor). Before the actual current of the PWM controller is acquired, said current being determined using the at least one A/D converter, the current is smoothed by means of a low pass filter. As a result of the current signal, or a voltage signal corresponding to a specific current, being smoothed, the time of an A/D conversion operation is largely independent of the current position within a PWM period. The smoothing of the current signal can either take place in the analog signal component or in the digital signal component of the current measuring path.

Preferably an analog low pass filter or a digital circuit which acts as a low pass filter can be used for the smoothing operation.

According to one preferred embodiment of the method, auto-calibration of the integrated circuit is carried out, during which auto-calibration correction values for the current are acquired and are used to correct the current. As a result, an absolute precision level of the current measured value—which precision level is limited owing to the usually in electronic components and in particular also in integrated analog components—can be increased even further. According to the method of auto-calibration, a continuous adjustment of the circuit is preferably carried out. This adjustment can be carried out in such a way that in addition to offset errors, which are long-term errors, short-term effects such as temperature fluctuations and voltage fluctuations are also compensated.

According to a first preferred embodiment of an auto-calibration method, the current is set using digital correction of the setpoint current demand.

The correction values preferably comprise offset values and gain factors.

The invention relates both to the method and to a circuit arrangement for measuring current.

In the circuit arrangement according to aspects of the invention, at least one low pass filter (11) for smoothing the current signal is provided in the signal path for measuring the current. In order to convert the current measured value, at least one A/D converter (19) and at least one current measuring element (30, 30') are provided. The low pass filter can be implemented either by means of an analog filter or a digital filter, in which case, depending on what kind of filter is used, the low pass filter is arranged either upstream or downstream of the A/D converter in the current-measuring signal path.

These and other aspects of the invention are illustrated in detail by way of the embodiments and are described with respect to the embodiments in the following, making reference to the Figures.

BRIEF DESCRIPTION OF THE DRAWINGS

The invention is best understood from the following detailed description when read in connection with the accompanying drawing. Included in the drawing are the following figures.

DETAILED DESCRIPTION OF THE PREFERRED EMBODIMENTS

Figure 1:
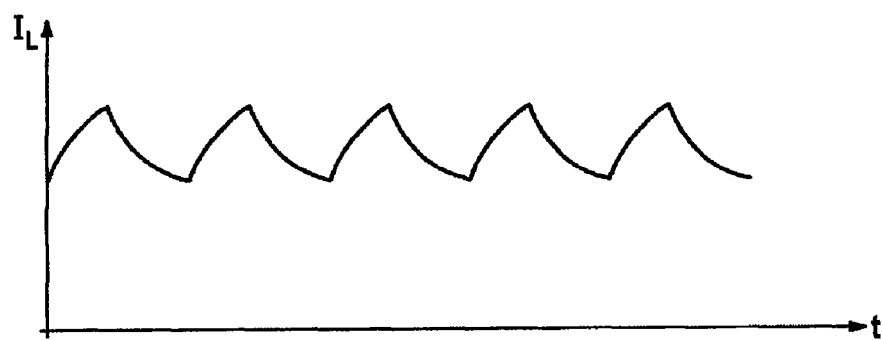
FIG. 1 shows the current profile in a PWM-controlled inductive load in a control circuit according to the prior art.
Figure 2:
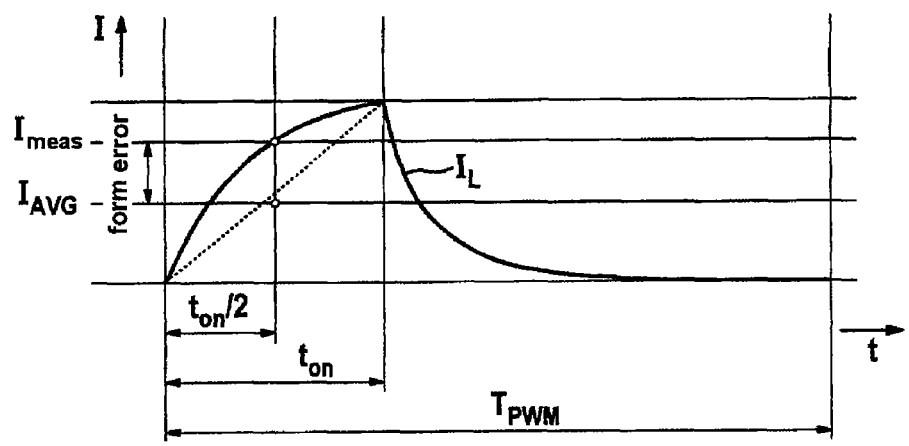
FIG. 2 shows just one PWM period of the current profile according to the prior art corresponding to FIG. 1.
Figure 3:
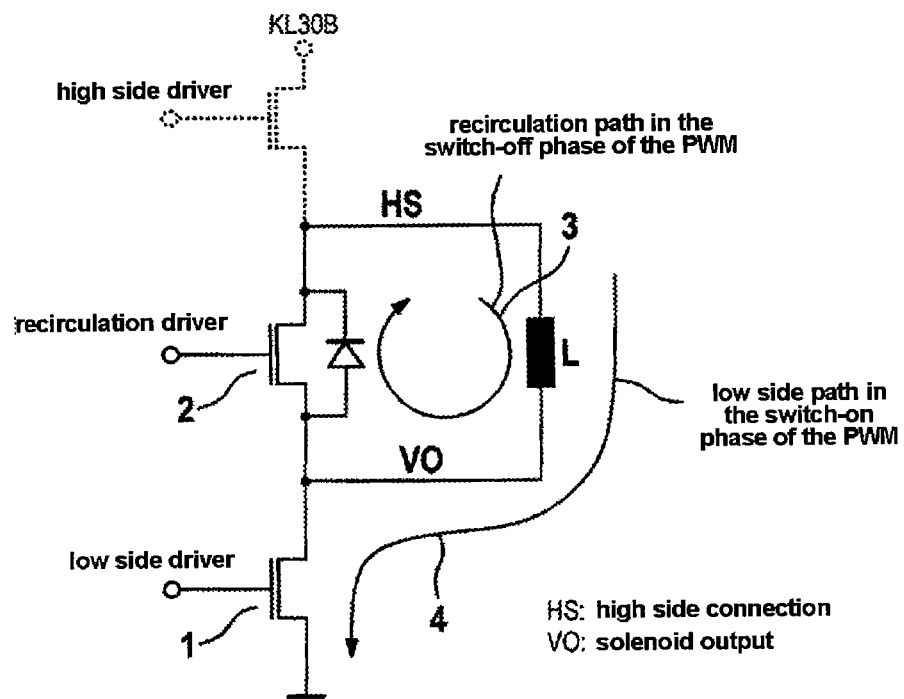
FIG. 3 shows a schematic illustration of an output stage circuit with recirculation path according to the prior art.

The schematic illustration of an output stage circuit which is illustrated in FIG. 3 and has a low side driver 1 and a recirculation driver 2 serves to explain the illustrated currents during PWM driving of the inductive load L. The load L is connected to ground via the low side driver 1, as a result of which the solenoid current rises exponentially when the maximum current has not yet been reached. In the switched-off state of the PWM driving means, the driver 2 is conductive, with the result that the decay current of the solenoid can flow through the recirculation path 3. This causes the current to decay exponentially.

According to one exemplary embodiment of the invention, the current of the recirculation path 3 is also measured in order to measure the actual current of the current control means. This provides the advantage that current can be measured even with relatively short switch-on times of the PWM driving means.

Figure 4:
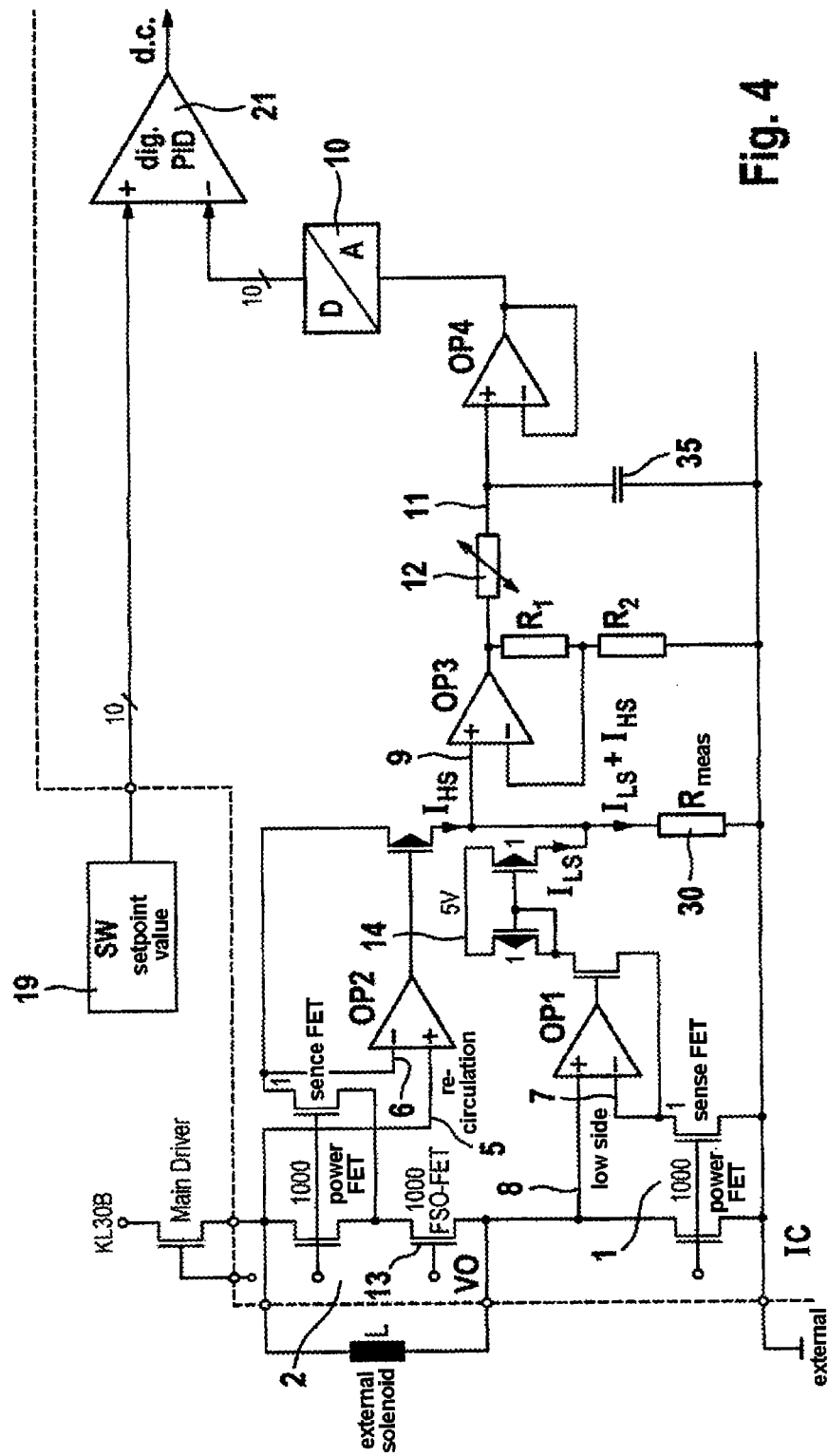
FIG. 4 shows a circuit arrangement for measuring current in the driving path and recirculation path.

In the circuit arrangement according to FIG. 4, the current measuring signal 5, 6 of the recirculation driver 2 and the current measuring signal 7, 8 of the driver 1 are combined to form a common sum signal 9 and are directed via a low pass filter 11. It is therefore possible to dispense with costly prioritization logic for A/D converters 10, which logic defines the sequence during the evaluation of a plurality of PWM stages. The low pass filter 11, 12 is embodied as a first order filter composed of a trimmable resistor 12 and a capacitor 35, in which case the time constant of the low pass filter can be changed through the possibility of trimming the resistor 12.

The currents in the respective power paths 1 and 2 are measured in a known fashion by means of sense FETs. Sense FETs make available a picture of the load current which is reduced by several orders of magnitude (for example a factor of 100-1000) and which flows through the power FETs. The measuring current 5, 6 and 7, 8, respectively, is amplified by means of sense amplifiers OP2 and OP1. The FSD-FET 13 illustrated in FIG. 4 is used to reduce the current more quickly (off-commutation), as is explained in patent application DE102004017239 (P 10676). By means of this reduction in the current which is known per se, the decay time of the solenoid current can be reduced from approximately 10 ms to approximately 1.5 ms.

The currents $I_{LS}$ and $I_{HS}$ are the currents of the low side path and of the recirculation path, respectively. The sum of the two currents $I_{LS}+L_{HS}$ produces a voltage drop at the measuring resistor $R_{meas}$ which is amplified by means of the operational amplifier OP3. So that the currents $I_{LS}$ and $I_{HS}$ have the same direction, the current from the low side measuring circuit is fed via a current mirror 14. The voltage which drops across the $R_{meas}$ is amplified by means of the operational amplifier OP3. Alternatively, the circuit can also be configured in such a way that the amplifier OP3 acts as a voltage follower.

According to an alternative circuit example (not illustrated), the measured low side current and the recirculation current can also be combined directly by means of an NMOS current mirror. However, for this purpose, it is necessary for the amplifier OP3 to be embodied as an inverting operational amplifier with the measuring resistor $R_{meas}$ in the feedback line, in which case the positive input is connected to a reference potential.

Since only either the current $I_{LS}$ or the current $I_{HS}$ ever flows during the operation of the circuit, an essentially continuous signal is available at the output of the amplifier OP3 within one PWM period, both during the switch-on time and during the switch-off time.

Figure 5:
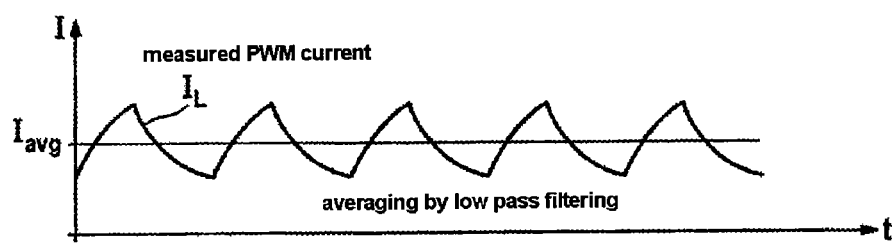
FIG. 5 shows a diagram for illustrating the smoothing of the current signal $I_L$ by means of low pass filtering.

In FIG. 5, $I_L$ denotes the voltage signal present at the output end of amplifier OP3 (FIG. 4) in the time profile. Since each voltage value is assigned a specific current value, for reasons of simplicity the corresponding voltage values are denoted as currents. $I_{avg}$ denotes the signal which is present at the output of the low pass filter 11, 12. In FIG. 5 it is apparent that the signal $I_{avg}$ still has a small residual ripple. Owing to the inductance of the load, the current $I_L$ is subject to strong fluctuations. In the case of time-discrete measurements of the current, different current measured values are obtained, at least when the measurements take place at different times. The signal $I_L$ is smoothed by the low pass filter 11, 12 whose cutoff frequency can be adapted. Time-discrete current measurements on which the smoothed signal $I_{avg}$ is based, can then be carried out with considerably greater precision than measurements using the unsmoothed signal $I_L$.

Figure 6:
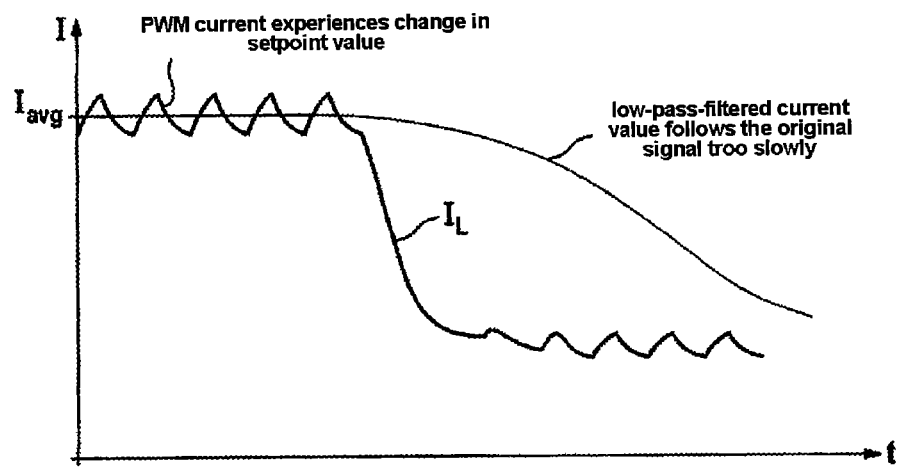
FIG. 6 shows corresponding smoothing of the current signal $I_L$ through low pass filtering when the cutoff frequency of the filter is too low.

FIG. 6 shows by way of example a load current $I_L$ which changes comparatively quickly and in which the smoothed current signal which is directed through the low pass filter 12, 11 no longer follows quickly enough. In this case, in order to ensure a functioning PWM control process, the time constant of the low pass filter has to be reduced. However, a correspondingly low time constant then brings about incomplete smoothing of the signal and finally gives rise to a certain reduction in the precision of the current control. Although the cutoff frequency can be set on average in such a way that on the one hand signal smoothing occurs and on the other the current signal still reacts quickly enough to changes in current, the maximum possible current measuring precision is thus not yet achieved.

By using an adaptive low pass filter with a variable cutoff frequency it is possible, while continuing to use a circuit which is sparing in terms of components, at the same time to achieve satisfactory smoothing and improved dynamics. The change in the cutoff frequency can come about, for example, through driving a MOS transistor as a controllable resistor 12 which has a linear resistance range which is sufficient for the present purpose of use. Alternatively, instead of the transistor 12, it is possible, for example, to use a switched capacitor circuit in which a variable resistance can be set by means of an auxiliary frequency which is used for driving purposes.

Figure 7:
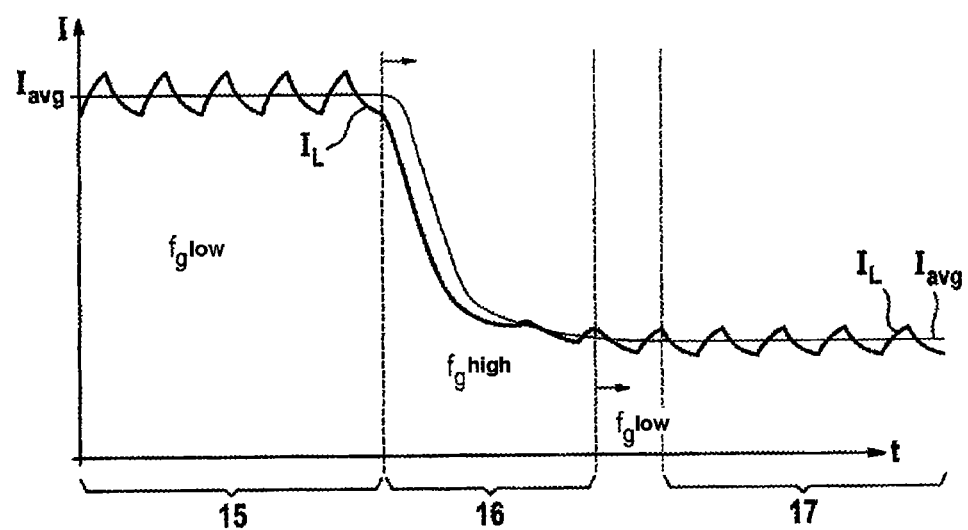
FIG. 7 shows corresponding smoothing of the current signal $I_L$ through low pass filtering with dynamic adaptation of the cutoff frequency of the filter.

The adaptation of the cutoff frequency of the filter will be explained below using FIG. 7. If a constant current $I_L$ is to be applied precisely in the time range 15, the cutoff frequency $f_g$ of the low pass filter can be set to a comparatively low value. If the PWM controller is made to bring about a comparatively rapid change in current (see time range 16) through a new setpoint current demand, the cutoff frequency of the low pass filter is reduced to such an extent that sufficient dynamics are ensured. If the setpoint value and actual value of the current approach one another (see range 17), the cutoff frequency $f_g$ is then reduced successively again—which is preferred according to aspects of the invention—in order to achieve a high level of precision of control of the current.

Figure 8:
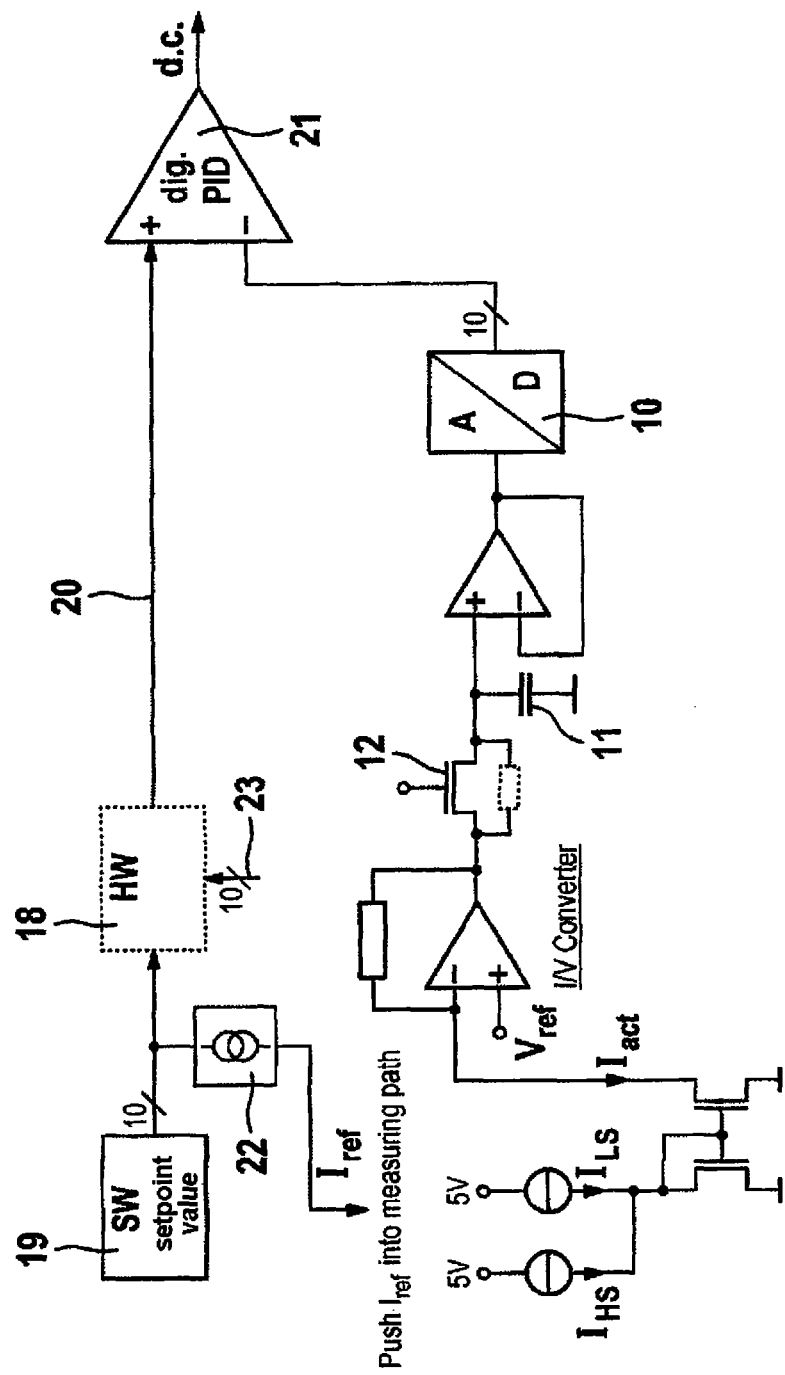
FIG. 8 shows an exemplary embodiment of a circuit arrangement with an auto-calibration device.
Figure 9:
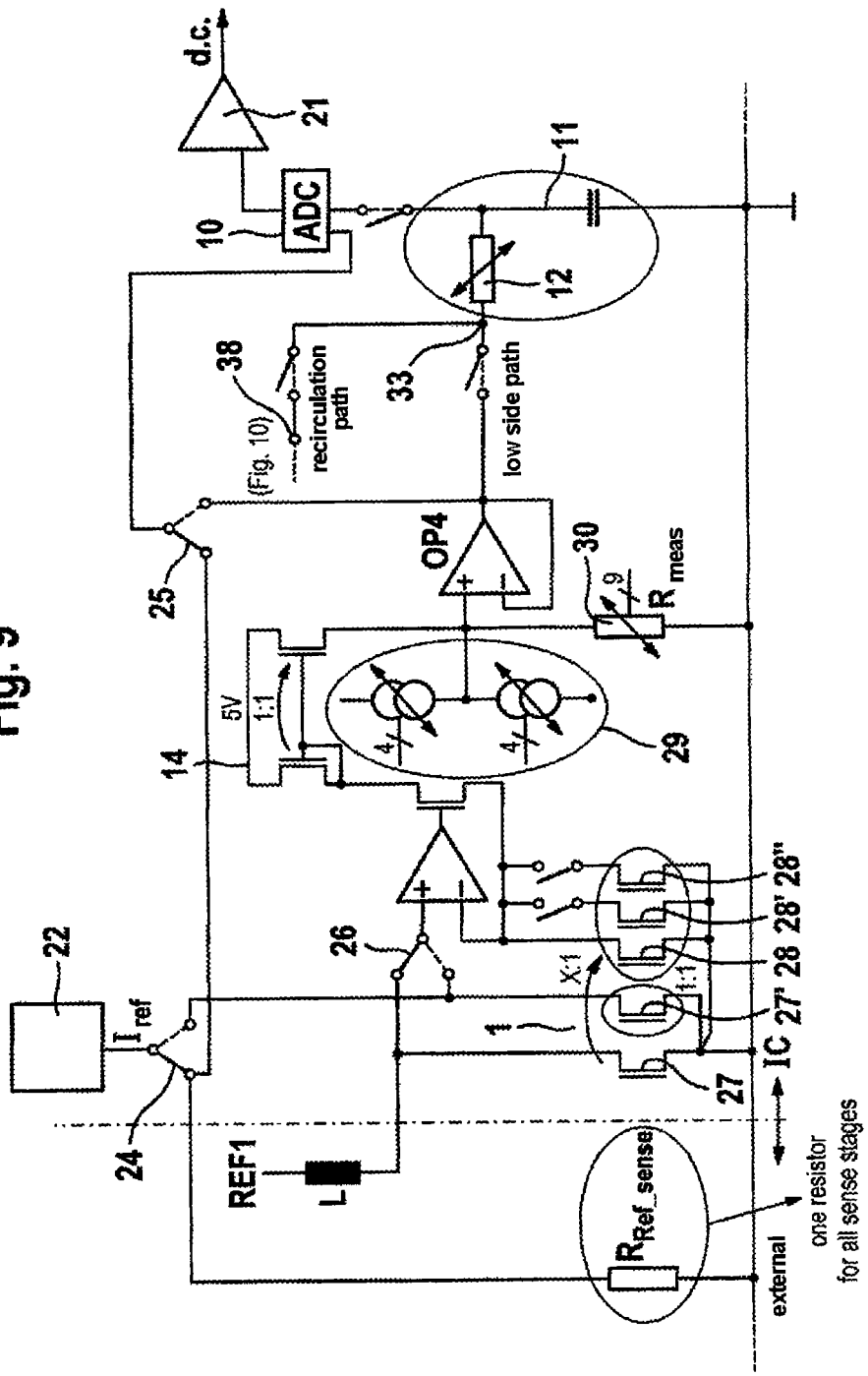
FIGS. 9 and 10 show a second exemplary embodiment of a circuit arrangement with an auto-calibration device and additional range adaptation means.

The circuit illustrated in FIG. 8 constitutes an exemplary embodiment with an auto-calibration device and is based on the circuit example in FIG. 4. In addition to the circuit in FIG. 4, a digital, that is to say programmable, reference current source 22 is present, with which a reference current $I_{ref}$ can be generated. $I_{ref}$ is fed into the current path of the load via corresponding lines, in which case the current is also conducted via a measuring resistor $R_{Ref\_sense}$ which is illustrated in FIG. 9. Since particular precision of the reference current sources is not necessary, they can expediently easily be built up from elementary transistors, a suitable number of which are connected in parallel. In order to determine the current which is generated by the digital current source, an external measuring resistor ($R_{ref\_sense}$ in FIG. 9 or $R_{ref\_redun}$ in FIG. 10) is provided. "External" means here that the measuring resistor is, in contrast to the other circuit components, not a component of the integrated circuit. A voltage tap (also not illustrated) on said measuring resistor is routed to the A/D converter 10. Furthermore, a digital compensation stage 18 is additionally provided. The compensation stage 18 comprises a digital input 23 with which a setpoint value (symbolized by box 19) which is predefined by the software can be corrected as a function of the digital input, for example by digitally adding or subtracting an offset value. The offset-compensated digital signal 20 is then fed into a digital PID controller 21 which serves to generate the duty cycle of the PWM (d.c.). The current sources $I_{LS}$ and $I_{HS}$, respectively, symbolize the measured low side current and recirculation current, respectively. If the digital result which occurs at the output of the A/D converter does not correspond to what is expected, this deviation is a measure of the error made by the low side measuring path or recirculation measuring path.

In the circuit corresponding to FIG. 8, a measuring current $I_{ref}$ is firstly fed into the low side path and subsequently into the recirculation path, and the actual current is respectively determined by means of the current measuring circuit. By comparing the actual current with the known measuring current $I_{ref}$, a correction value is determined which is taken into account in the form of a digital correction in the compensation circuit 18 in order to correct the setpoint value 19. If the comparison measurements are carried out differentially, it is also advantageously possible here for the A/D converter error to be taken into account. The compensation circuit leads to considerably more precise setting of the current during the PWM control process, in particular if each measuring path is evaluated separately in terms of its quality by correspondingly feeding in the measuring current $I_{ref}$. This can be done particularly easily by virtue of the fact that the measuring current passes through the low side path and the recirculation path simultaneously. A further advantage of the compensation circuit which is described above is that less expensive, less precise analog ICs can be used.

Figure 10:
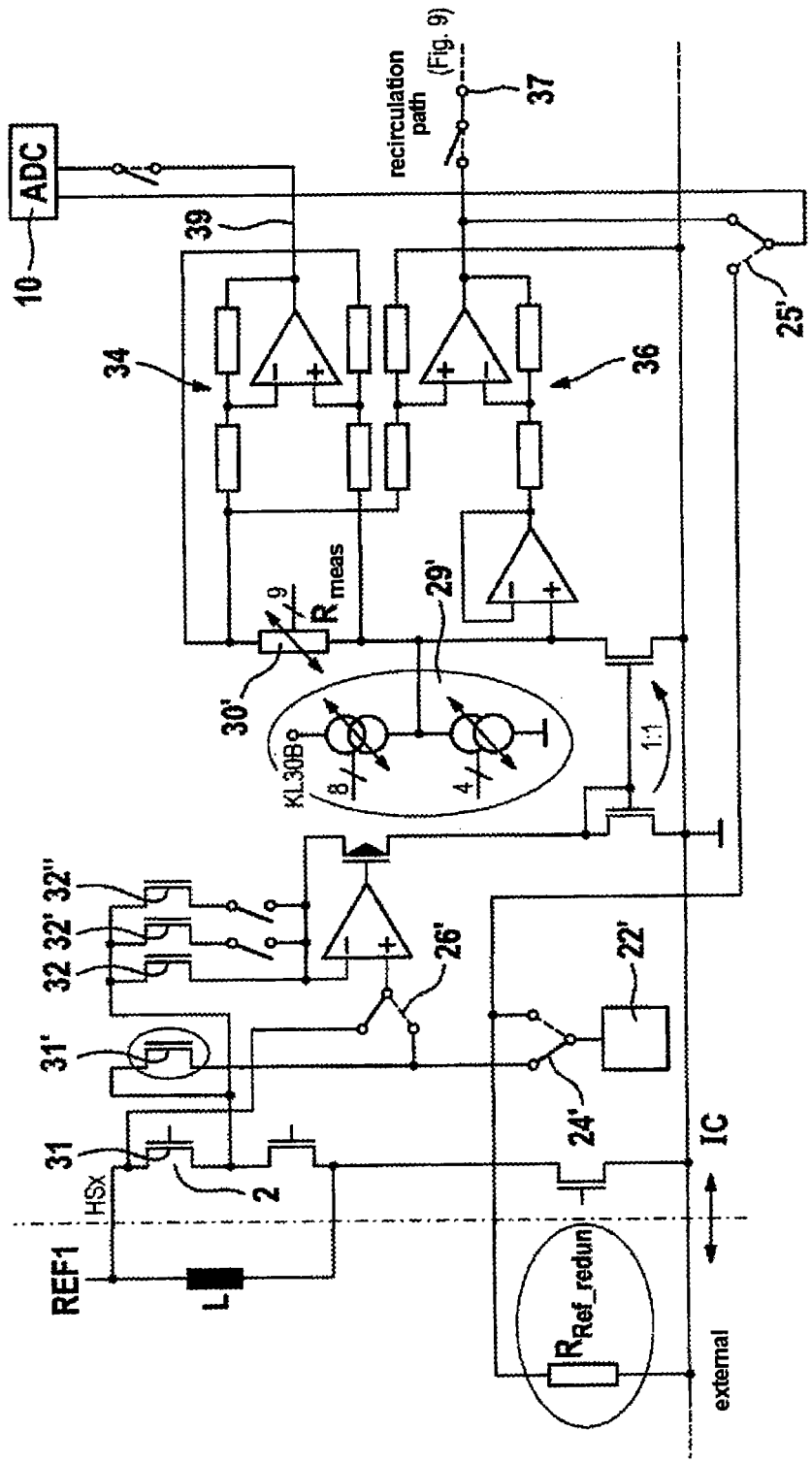

The circuit illustrated in FIGS. 9 and 10 illustrates a second exemplary embodiment with an auto-calibration device, and for reasons of simplified illustration the circuit components for the low side path are illustrated in FIG. 9, and the circuit components for the recirculation path are illustrated in FIG. 10. The circuit is similar to the circuit in FIG. 8 and FIG. 4 so that only the existing differences will be explored below. In contrast to the current summation in FIG. 4, in the concept according to FIGS. 9 and 10 the current measured value of the low side path and of the recirculation path are combined with one another by means of a voltage signal (node point 33). In principle, instead of the exemplary analog signal processing it is also possible to process digital data. In this case, the combination will expediently be implemented by means of a digital summing element. With the switch 24 (24' in FIG. 10), the reference current $I_{ref}$ which is fed in by the reference current source 22 (22' in FIG. 10), can be directed via the measuring resistor $R_{Ref\_Sense}$ ($R_{Ref\_redun}$ in FIG. 10) or through the low side path 1 (recirculation path 2 in FIG. 10). Correspondingly, the input of the A/D converter 10 is connected either to $R_{Ref\_Sense}$ or to the low side path 1 by means of the switches 25 and 26 (25' and 26' in FIG. 10). The arrangement of the power FET 27 (31 in FIG. 10) and sense FET 28 (32 in FIG. 10) in the low side path 1 comprises additional amplifier stages 27' and 28' which permit the measuring range to be adapted (see description further below). The offset can be compensated with the offset compensation stage 29 (29' in FIG. 10), which is connected to the input of the operational amplifier OP4. In FIG. 10, the output of the compensation stage 29' is connected to similarly acting, further differential amplifier stages 34, 36 which are explained in more detail below. An analog current signal for the recirculation path is available at the output 37 of the amplifier stage 36, said recirculation path being connected to the terminal 38 in FIG. 9.

A description is given below of how the individual measuring paths of the low side path and of the recirculation path can be adjusted by using trimmable current sources and resistances. To be more precise, this means that the reference current measurements have to respectively be carried out separately for the low side path and the recirculation path. First, a defined current is directed via $R_{Ref\_Sense}$ (FIG. 9). In this context, the switches 24 and 25 are in the position shown by unbroken lines in FIG. 9. $I_{Ref}$ is read out by means of the A/D converter 10. This defined current is then also applied to FET 27'. The switches 24, 25 and 26 are then in the switched position illustrated by dashed lines. The current flowing through the sense FET 28 is read out by means of the A/D converter 10. The above measurements are then repeated once more with a relatively low current. Corresponding to the measurements carried out with various reference currents, gain trimming is performed by means of a digital trimming resistor 30 (30' in FIG. 10) in FIG. 4. Furthermore, offset trimming is carried out with the circuit component 29.

The calibration steps described above are preferably carried out iteratively both for the low side path (FIG. 9) and for the recirculation path (FIG. 10), in which case as the number of steps increases, the precision consisting of the offset and the gain factor increases incrementally. After a few iteration steps, the method can already generally be aborted since the precision of the iterative method then only increases to a small degree.

The above circuit examples each relate to a load driving channel of a multi-channel PWM output stage. Parts of the circuits, such as for example the external measuring resistor $R_{Ref\_Sense}$, are, however, only present once and are used by each channel of the stage. Correspondingly, the reference current measurements which relate to the external measuring resistor only have to be carried out once. All the other calibration measurements have to be carried out separately for each output stage channel.

The calibration method which is described above can also be repeated or continued at later times, even during the control process, on condition that the respective channel which is to be calibrated is not driven by the PWM driving means at this time.

The circuit examples in FIGS. 9 and 10 comprise, in addition to the FETs 27, 28, 31 and 32, also additional circuit means 28, 28', 28", 32, 32' and 32" for increasing the resolution in the active current range. In the case of a 10 bit A/D converter, the resolution is limited over a range of 3 A to approximately 3 mA. A higher resolution can be achieved by limiting the measurable current range to a specific, required dynamic range. Therefore, for example with the circuit shown in FIG. 8 or FIG. 9, switching over is possible between 1 A, 2 A and 3 A measurable maximum current through separately adding equally large sense FETs 28' and 32'. Correspondingly, a possible resolution of 1 to 3 mA results in the respective range.

The selection of the current measuring range can be carried out by means of a logic unit, for example by taking into account the setpoint value of the current at that particular time.

The resolution of the A/D converter can also correspondingly be utilized better by firstly subtracting a suitable offset value and adding it again later, after the A/D conversion.

In addition it is possible, according to a further example of a circuit arrangement according to aspects of the invention, to extend said circuit arrangement with fail-safe structures 34 in such a way that a redundant current signal is available. It is particularly expedient here if the A/D converter 10 is provided, on the line 39, with a measuring signal which is inverted compared to the other redundancy path (difference amplifier stage 36 composed of the voltage follower OP and downstream difference OP) or changed (see difference amplifier 34), as a result of which the A/D conversion can be checked.

While preferred embodiments of the invention have been described herein, it will be understood that such embodiments are provided by way of example only. Numerous variations, changes and substitutions will occur to those skilled in the art without departing from the spirit of the invention. It is intended that the appended claims cover all such variations as fall within the spirit and scope of the invention.

The invention claimed is:

1. A method of measuring a current within an integrated PWM control circuit by means of at least one A/D converter, said method comprising the steps of:
   driving an inductive load by means of a PWM controller;
   smoothing the current by means of a low pass filter; and
   determining the current of the PWM controller using the at least one A/D converter after said smoothing step,
   wherein an upper cutoff frequency of the low pass filter or a time constant of the low pass filter can be varied, and said time constant is varied as a function of a PWM setpoint current or of a change in the PWM setpoint current.

2. The method as claimed in claim 1, wherein the at least one A/D converter is integrated into the circuit.

3. The method as claimed in claim 1, wherein said PWM controller is arranged in an electronic circuit of an electronic controller for a motor vehicle brake system.

4. The method as claimed in claim 1, wherein the smoothing of the current is carried out by a low pass circuit of a first order or of a higher order.

5. The method as claimed in claim 1, wherein the upper cutoff frequency or the time constant of the low pass filter is selected in such a way that the upper cutoff frequency of the inductive load is not undershot, the time constant of the low pass filter is not exceeded, or both the inductive load is not undershot and the time constant of the low pass filter is not exceeded.

6. The method as claimed in claim 1, further comprising the step of auto-calibration to increase an accuracy of the current measurement,
   said auto-calibration step including the sub-steps of:
   directing a reference current through: (1) a current path of the PWM controller for a specific time, (2) a recirculation current path, or (3) the current path of the PWM controller and the recirculation current path, and
   acquiring one or more correction values on the basis of the current signal measured in said specific time.

7. The method as claimed in claim 6, wherein at least one PWM driver has a driving path and a recirculation path, and the reference current is fed both through the recirculation path and through the driving path, wherein separate correction values are respectively formed and used for the recirculation path and the driving path.

8. The method as claimed in claim 6, wherein a reference current is directed via a current measuring component, and said A/D converter is used to produce at least one correction value for said auto-calibration at an output of the A/D converter which is connected to the current measuring component.

9. The method as claimed in claim 6, wherein at least one correction value is used to correct an actual current, a setpoint current, or both the actual current and the setpoint current, and after said auto-calibration step, the at least one correction value is used to correct the measured current signal or to correct a setpoint value of the PWM controller during the measurement of current.

10. A circuit arrangement in an electronic controller for motor vehicle brake systems having:
   a multi-channel PWM output stage which is arranged in an integrated circuit and drives inductive loads,
   wherein at least one A/D converter that is also integrated into the integrated circuit is used to measure the actual current which flows through an inductive load,
   wherein a low pass filter that is present in a signal path for measuring the current smoothes the current signal,
   wherein at least one output stage driver comprises a driving path and a recirculation path,
   wherein an electronic component for measuring current is provided both in the recirculation path and in the driving path, and
   wherein a current value which is determined in the recirculation path and a current value which is determined in the driving path are combined by means of a summing element to form a common current signal or voltage signal.

11. The circuit arrangement as claimed in claim 10, wherein the low pass filter is an analog low pass filter of the first order, second order or a higher order.

12. The circuit arrangement as claimed in claim 10, wherein the low pass filter is implemented: (1) with discrete components outside the integrated circuit, (2) by means of a switched capacitor technology within the integrated circuit, (3) by means of an integrated circuit, or (4) any combination thereof.

13. The circuit arrangement as claimed in claim 10, wherein the circuit for measuring the current comprises at least one resistance component, wherein the current is determined by means of a drop in voltage.

14. The circuit arrangement as claimed in claim 10, wherein the circuit for measuring the current comprises at least one sense FET.

15. The circuit arrangement as claimed in claim 10, wherein the recirculation path is switched actively.

16. The circuit arrangement as claimed in claim 10 wherein the summing element is a circuit node point or a digital summing element.

17. The circuit arrangement as claimed in claim 10, wherein either the current signal which is determined by the recirculation path or the current signal which is determined by the driving path is fed in via a current mirror before combination so that both current signals which are determined from the various paths have the same current direction.

18. The circuit arrangement as claimed in claim 10, wherein the PWM output stage can be calibrated in terms of: (1) the current offset, (2) the gain factor by means of correction values, or (3) any combination thereof, wherein the correction values are acquired by:
   directing a reference current through: (a) a current path of the PWM controller for a specific time, (b) a recirculation current path, or (c) the current path of the PWM controller and the recirculation current path, and
   acquiring one or more correction values on the basis of the current signal measured in said specific time.

19. The circuit arrangement as claimed in claim 10, wherein a range switching means is provided for the at least one A/D converter so that the at least one A/D converter which has a specific resolution as a result of a fixed bit number for a specific, predefined current range can be operated through input-side limitation of the current range with a relatively high current resolution.

20. The circuit arrangement as claimed in claim 19, wherein the range switching is performed automatically by means of a logic means as a function of a setpoint current and predefined setpoint current ranges.

21. The circuit arrangement as claimed in claim 19, wherein, in addition to the range switching, switching elements are provided for offset subtraction, with which elements an increase in a usable A/D converter resolution is achieved.

22. The use of the circuit arrangement as claimed in claim 10 in a controller for electronic motor vehicle brake systems, in which electromagnetic hydraulic valves are used, by means of PWM output stages, for setting a hydraulic pressure within wheel brakes of the motor vehicle.

* * * * *

UNITED STATES PATENT AND TRADEMARK OFFICE
CERTIFICATE OF CORRECTION

PATENT NO. : 8,704,508 B2  
APPLICATION NO. : 12/300488  
DATED : April 22, 2014  
INVENTOR(S) : Fey et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1551 days.

Signed and Sealed this

Twenty-ninth Day of September, 2015

Michelle K. Lee
*Director of the United States Patent and Trademark Office*